(12) United States Patent
Schuegraf et al.

(10) Patent No.: US 6,831,347 B1
(45) Date of Patent: Dec. 14, 2004

(54) SHALLOW TRENCH ISOLATION USING LOW DIELECTRIC CONSTANT INSULATOR

(75) Inventors: Klaus F. Schuegraf, Boise, ID (US); Aftab Ahmad, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 435 days.

(21) Appl. No.: 08/932,228

(22) Filed: Sep. 17, 1997

Related U.S. Application Data

(62) Division of application No. 08/547,620, filed on Oct. 24, 1995, now Pat. No. 5,702,976.

(51) Int. Cl.[7] .............................................. H01L 29/00
(52) U.S. Cl. ........................ 257/510; 257/506; 257/513
(58) Field of Search ................................ 257/506–510, 257/513, 752; 438/218, 219, 221, 424, 427, 435, 789, 790

(56) References Cited

U.S. PATENT DOCUMENTS

| | | | |
|---|---|---|---|
| 4,502,914 A | 3/1985 | Trumpp et al. | 438/424 |
| 4,748,134 A | 5/1988 | Holland et al. | 437/62 |
| 5,087,586 A | 2/1992 | Chan et al. | 438/429 |
| 5,169,491 A | 12/1992 | Doan | 438/693 |
| 5,191,509 A | 3/1993 | Wen | 257/304 |
| 5,302,233 A | 4/1994 | Kim et al. | 438/692 |
| 5,356,828 A * | 10/1994 | Swan et al. | 438/433 |
| 5,366,590 A | 11/1994 | Kadomura | 438/723 |
| 5,372,951 A * | 12/1994 | Anjum et al. | 438/440 |
| 5,429,995 A * | 7/1995 | Nishiyama et al. | 438/788 |
| 5,459,096 A * | 10/1995 | Venkatesan et al. | 438/437 |
| 5,470,783 A | 11/1995 | Chiu et al. | 438/446 |
| 5,492,858 A * | 2/1996 | Bose et al. | 438/437 |
| 5,530,293 A | 6/1996 | Cohen et al. | 257/752 |
| 5,712,186 A | 1/1998 | Thakur et al. | 437/69 |
| 5,846,888 A | 12/1998 | Chapek et al. | 438/770 |

FOREIGN PATENT DOCUMENTS

JP        153717        11/1994

OTHER PUBLICATIONS

Kirk–Othmer, Encyclopedia of Chemical Technology, Second Completely Revised Edition, vol. II, 1966, pp. 791–792.
Silicon Processing for the VLSI ERA, Isolation Technologies for Integrated Circuits, vol. II, Ch. 2, pp. 12–83.

* cited by examiner

*Primary Examiner*—Hung Vu
(74) *Attorney, Agent, or Firm*—Knobbe, Martens, Olson & Bear LLP

(57) ABSTRACT

A shallow trench isolation is disclosed wherein the trench depth is reduced beyond that achieved in prior art processes. The reduced trench depth helps to eliminate the formation of voids during the trench refill process and provides for greater planarity in the final isolation structure. Effective device isolation is achieved with a reduced trench depth by utilizing refilling dielectric materials having low dielectric constant.

10 Claims, 4 Drawing Sheets

US 6,831,347 B1

SHALLOW TRENCH ISOLATION USING LOW DIELECTRIC CONSTANT INSULATOR

This application is a divisional of U.S. patent application Ser. No. 08/547,620, filed Oct. 24, 1995 now U.S. Pat. No. 5,702,976.

FIELD OF THE INVENTION

The invention relates generally to silicon integrated circuit design and process technology. In particular, the invention pertains to trench isolation process technology.

BACKGROUND OF THE INVENTION

Implementing electronic circuits involves connecting isolated devices through specific electronic paths. In silicon integrated circuit fabrication it is necessary to isolate devices from one another which are built into the same silicon matrix. They are subsequently interconnected to create the desired circuit configuration. In the continuing trend toward higher device densities, parasitic interdevice currents become more problematic, thus isolation technology has become one of the most critical aspects of contemporary integrated circuit fabrication.

Over the last few decades a variety of successful isolation technologies have been developed to address the requirements of different integrated circuit types such as NMOS, CMOS and bipolar. In general, the various isolation technologies exhibit different attributes with respect to such characteristics as minimum isolation spacing, surface planarity, process complexity and defect density generated during isolation processing. Moreover, it is common to trade off some of these characteristics when developing an isolation process for a particular integrated circuit application.

In metal-oxide-semiconductor (MOS) technology it is necessary to provide an isolation structure that prevents parasitic channel formation between adjacent devices, such devices being primarily NMOS or PMOS transistors or CMOS circuits. The most widely used isolation technology for MOS circuits has been that of LOCOS isolation, an acronym for LOCal Oxidation of Silicon. LOCOS isolation essentially involves the growth of a recessed or semirecessed oxide in unmasked non-active or field regions of the silicon substrate. This so-called field oxide is generally grown thick enough to lower any parasitic capacitance occurring over these regions, but not so thick as to cause step coverage problems. The great success of LOCOS isolation technology is to a large extent attributed to its inherent simplicity in MOS process integration, cost effectiveness and adaptability.

In spite of its success, several limitations of LOCOS technology have driven the development of alternative isolation structures. A well-known limitation in LOCOS isolation is that of oxide undergrowth at the edge of the mask which defines the active regions of the substrate. This so-called bird's beak (as it appears) poses a limitation to device density, since that portion of the oxide adversely influences device performance while not significantly contributing to device isolation. Another problem associated with the LOCOS process is the resulting circuit planarity or lack thereof. For submicron devices, planarity becomes an important issue, often posing problems with subsequent layer conformality and photolithography.

Trench isolation technology has been developed in part to overcome the aforementioned limitations of LOCOS isolation for submicron devices. Refilled trench structures essentially comprise a recess formed in the silicon substrate which is refilled with a dielectric material. Such structures are fabricated by first forming submicronsized trenches in the silicon substrate, usually by a dry anisotropic etching process. The resulting trenches typically display a steep sidewall profile as compared to LOCOS oxidation. The trenches are subsequently refilled with a dielectric such as chemical vapor deposited (CVD) silicon dioxide ($SiO_2$). They are then planarized by an etchback process so that the dielectric remains only in the trench, its top surface level with that of the silicon substrate. The etchback process is often performed by etching photoresist and the deposited silicon dioxide at the same rate. The top surface of the resist layer is highly planarized prior to etchback through application of two layers of resist, and flowing the first of these layers. Active regions wherein devices are fabricated are those that were protected from etch when the trenches were created. The resulting structure functions as a device isolator having excellent planarity and potentially high aspect ratio beneficial for device isolation. Refilled trench isolation can take a variety of forms depending upon the specific application; they are generally categorized in terms of the trench dimensions: shallow trenches (<1 µm), moderate depth trenches (1–3 µm), and deep, narrow trenches (>3 µm deep, <2 µm wide). Shallow Trench Isolation (STI) is used primarily for isolating devices of the same type and is often considered an alternative to LOCOS isolation. Shallow trench isolation has the advantages of eliminating the birds beak of LOCOS and providing a high degree of surface planarity.

The basic trench isolation process is, however, subject to drawbacks, one of these being void formation in the trench during dielectric refill. Such voids are formed when the refilling dielectric material forms a constriction near the top of a trench, preventing flow of the material into the trench interior. Such voids compromise device isolation as well as the overall structural integrity. Unfortunately, preventing void formation during trench refill often places minimum size constraints on the trenches themselves, which may compromise device packing density or device isolation. For example, a key parameter measuring device isolation is the field threshold voltage between adjacent devices, that is, the voltage necessary to create a parasitic channel beneath a field oxide region linking adjacent devices. The field threshold voltage is influenced by a number of physical and material properties of the trench isolator such as insulator thickness, dielectric constant E, substrate doping, field implant dose and substrate bias. Thus, a principal difficulty in decreasing the trench depth is the compromise in device isolation. Clearly, it is highly desirably to develop a shallow trench isolation process which overcomes the problem of void formation while providing effective device isolation.

SUMMARY OF THE INVENTION

It is an object of the present invention to provide a trench isolation process which alleviates the problem of void formation during dielectric refill. It is another object of the present invention to provide a trench isolator having reduced dimensions, advantageous for device density and wafer planarity. It is a further object of the present invention to provide a shallow trench isolator having enhanced device isolation characteristics.

In accordance with one aspect of the present invention, a process for isolating devices on a semiconductor substrate comprises first removing portions of the semiconductor substrate, thereby forming recesses preferably having a trench profile. The trenches are then refilled with a material having a dielectric constant lower than the dielectric constant of silicon dioxide which is about 3.9. Using a low-i dielectric material allows the trench dimensions to be reduced while still providing effective device isolation characteristics. Preferably, the dielectric material comprises a halide-doped glass such as Fluorine-doped $SiO_2$. To insure against device contamination, the invention further comprises forming a barrier layer over the trenches prior to refilling them with the low-$\epsilon$ dielectric material.

In accordance with another aspect of the present invention, an isolation structure in a semiconductor substrate comprises a recessed trench formed in the semiconductor substrate and a material having a low dielectric constant filling the trench. The trench structure preferably has a depth less than 250 nm, and furthermore comprises a barrier layer disposed between the interior trench surface and the dielectric material. The dielectric material preferably has a dielectric constant lower than about 3.9, and may comprise a Fluoride-doped silicon dioxide composition.

In accordance with yet another aspect of the present invention, a method of reducing the formation of voids in a refilled trench isolation process comprises forming trenches having an aspect ratio less than about 2:1, and then refilling the trenches with a material having a dielectric constant less than the dielectric constant of silicon dioxide. The trenches preferably have a depth of less than 200 nm, and are refilled with a material comprising a Fluorine-doped silicon dioxide composition.

These and other aspect and attributes of the present invention will become more fully apparent with the following detailed description and accompanying figures.

DETAILED DESCRIPTION OF THE INVENTION

In accordance with the principles of the present invention, an improved shallow trench isolation technology utilizes a trench that is shallower than prior art trenches, and yet provides the same degree of device isolation. The shallower trench helps prevent the formation of voids during dielectric refill. However, despite the smaller dimensions of the present inventive trench, equivalent device isolation is achieved through use of a dielectric refill having a lower dielectric constant $\epsilon$ than in prior art isolation trenches. To better illustrate these inventive principles, a brief description of an exemplary STI process is provided first hereinbelow.

Figure 1A:
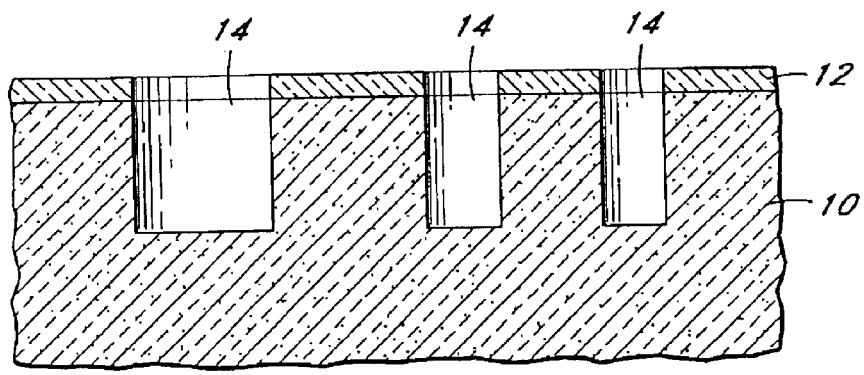
FIGS. 1A-1C are schematic sections illustrating an exemplary shallow trench isolation process.

An exemplary STI process may comprise first a masking, patterning and dry etch process, producing trenches in the silicon substrate as shown in FIG. 1A. The semiconductor substrate 10 is masked and patterned to expose the regions of the substrate to be etched. The mask 12 may for example comprise a resist layer which is resistant to the dry anisotropic etch used to create the trenches. The mask 12 may be patterned by conventional photolithographic means to define the regions of the substrate 10 to have trenches formed therein. The trenches 14 are formed by an anisotropic dry etch, such as a plasma or reactive ion etch. A preferred characteristic of the trenches 14 is the steep sidewall profile as compared to conventional LOCOS processes.

Figure 1B:
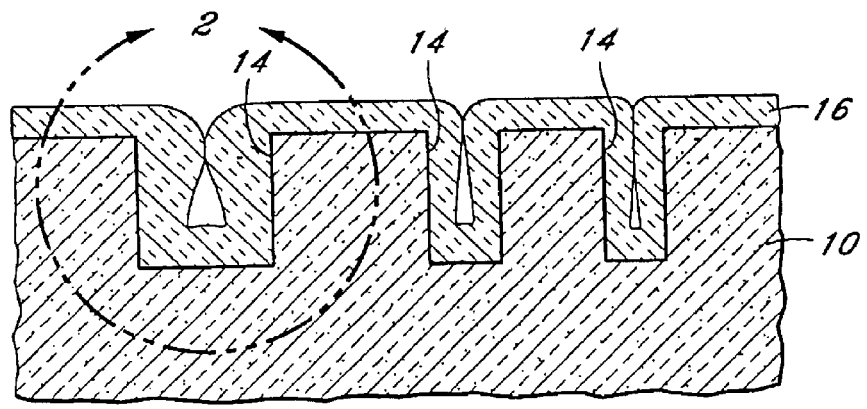
Figure 1C:
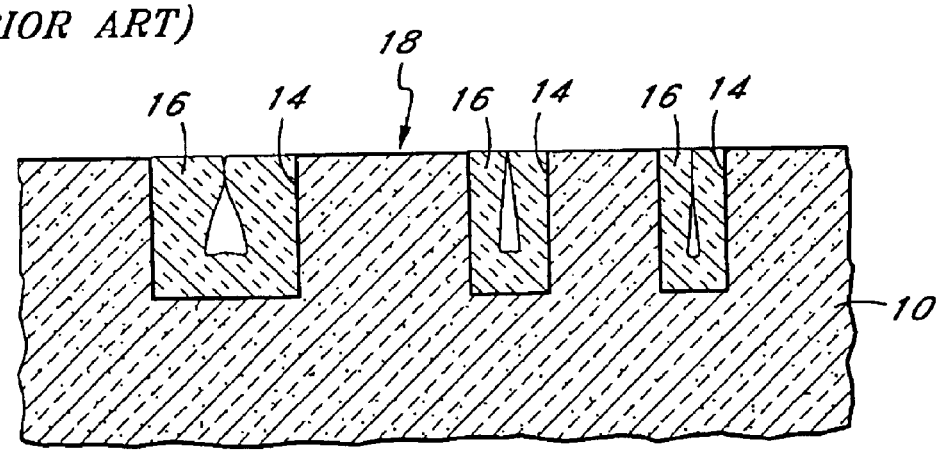

After the trenches 14 are formed, the mask 12 is removed by selective etching or chemical mechanical polishing and the trenches are refilled with a dielectric material 16, as shown in FIG. 1B. A preferred dielectric refill material for STI is chemical vapor deposited silicon dioxide (CVD-$SiO_2$) due to its high quality and excellent conformality. Conformality is particularly important because the refilled material must be supplied to fill trenches having relatively high aspect ratios (height:width>1).

Following the trench refill 16, the top surface of the substrate 10 is planarized by an etchback process, typically also performed using a chemical/mechanical polish. Prior to etchback, the substrate 10 may be coated with a layer of photoresist (not shown) in order to provide a planar surface with which to begin the etchback. The etchback itself provides a planarized substrate surface 18, having dielectric material 16 filling the trenches 14 up to and level with the top surface 18.

Figure 2:
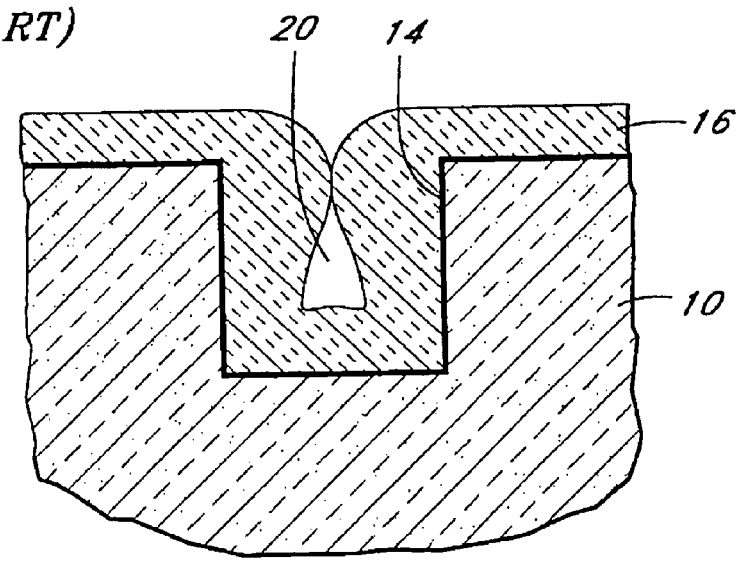
FIG. 2 is a schematic section of a trench refill having a void.

As shown in FIG. 2, a common problem associated with trench refill isolation is the formation of voids in the trenches. During refill of the trench 14 with dielectric material 16, the trench 14 often becomes constricted near the top of the trench, thereby preventing complete refill of the trench, resulting in a void 20. The void 20 lowers the isolation characteristics of the refilled trench in addition to introducing structural instabilities in subsequent processes. Increasing the trench width can alleviate void formation, however it also undesirably decreases device density.

In accordance with the principles of the present invention, void formation is alleviated by decreasing trench depth. Utilizing shallower trenches decreases the possibility of void formation and favorably increases surface planarity of the final refilled trench structure. For example in a typical DRAM application, a trench in accordance with the present invention may have dimension of approximately 200 nm deep and 250 nm wide while prior art trenches typically have dimensions of approximately 275 nm deep and 350 nm wide. However, as is well known in the art, a key parameter measuring device isolation is the field threshold voltage between adjacent devices, that is, the voltage necessary to create a parasitic channel beneath a field oxide region linking adjacent devices. The field threshold voltage is influenced by a number of physical and material properties of the trench isolator such as insulator thickness, dielectric constant $\epsilon$, substrate doping, field implant dose and substrate bias. Thus, a principal difficulty in decreasing the trench depth is the compromise in device isolation.

To circumvent this problem, the shallow trench isolation of the present invention maintains effective device isolation in a shallower trench by utilizing dielectric materials having a lower dielectric constant than used in the prior art. For a given trench geometry, the field threshold voltage is a decreasing function of the field dielectric constant. Thus, to compensate for smaller trench dimensions, the present invention utilizes dielectric materials having lower dielectric constant. A possible dielectric material is a low index glass such as a halide-doped silicon dioxide, deposited by introducing the halide during CVD of silicon dioxide. For example, F:$SiO_2$ possesses a dielectric constant of approximately 3.2, while typical CVD-$SiO_2$ has a dielectric constant of about 3.9. Use of such materials allows a relative decrease in trench depth by about 20%.

Fluorine or other elements comprising a reduced dielectric constant material may however cause deleterious effects on neighboring devices if they diffuse into adjacent active areas. Therefore, a preferred embodiment of the present invention also incorporates a diffusion barrier layer lining the trench so as to prevent dopant migration into the silicon substrate. Use of a preferred barrier layer in the form of a grown oxide or nitride film, or a deposited stoichiometric or non-stoichiometric oxide or nitride film inhibits contamination of the isolation field-effect transistor, thereby preserving desirable characteristics such as a high threshold voltage. The integrated devices subject to isolation are also protected by the barrier layer from contamination.

Figure 3A:
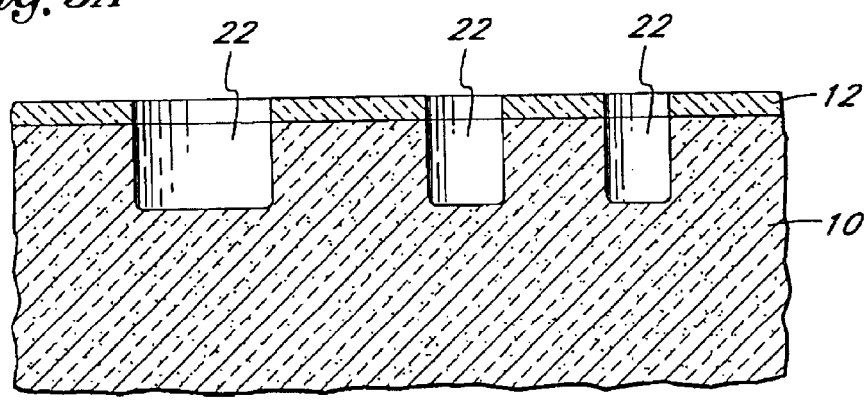
FIGS. 3A-3D are a schematic section illustrating an embodiment of the present shallow trench isolation process.

In accordance with the aforementioned principles, a preferred shallow trench isolation may for example comprise the following process steps illustrated in FIGS. 3A-3D. As shown in FIG. 3A, the silicon wafer 10 is first covered by a mask 12, such as a resist or silicon oxide/nitride bilayer, and then patterned and etched to define the field isolation regions. The wafer is then subject to a dry anisotropic etch such as a halide plasma complex, thereby forming the trenches 22 in the silicon substrate 10. As mentioned earlier, in comparison to the prior art trench isolation, the trenches of the present invention are about 200 nm deep, shallower than the prior art by about 20%.

Figure 3B:
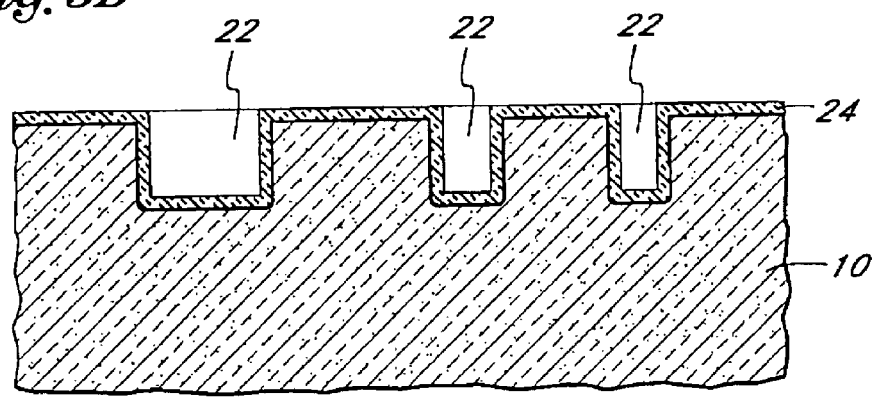

As mentioned previously, to avoid contamination of substrate regions adjacent to the trenches 22, it is preferable to form a barrier layer 24 over the trenches 22 prior to dielectric refill as shown schematically in FIG. 3B. The barrier layer 24 may for example comprise a silicon oxide or nitride film grown in an appropriate ambient or a chemical vapor deposited oxide or nitride film at least 5 nm thick. The barrier layer 24 functions to prevent diffusion of dopants deposited during the subsequent dielectric refill process. Although in general nitride forms a superior diffusion barrier to oxide, the higher dielectric constant of nitride should be considered in the overall isolation structure. It may be for example, that oxide performs adequately as a diffusion barrier while having the advantage of a lower dielectric constant than nitride, Thus, barrier layer thickness and dielectric constant should be considered in the overall trench design.

Figure 3C:
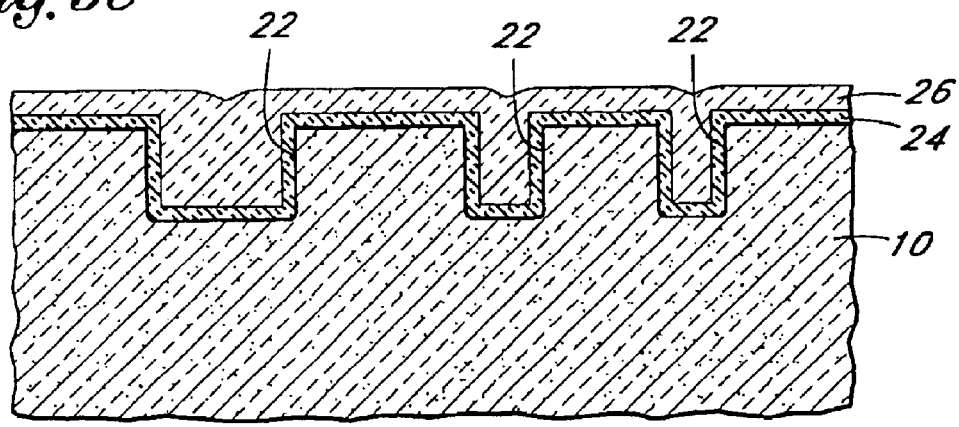

A shown in FIG. 3C, the trenches 22 are refilled with a dielectric material 26 having a low dielectric constant $\epsilon$ of about 3.3. As mentioned previously, the use of a low dielectric constant material lowers the gate capacitance of the isolation field-effect transistor, thereby raising the threshold voltage. A CVD-$SiO_2$ doped with a halide such as Fluorine is a presently preferred material.

Figure 3D:
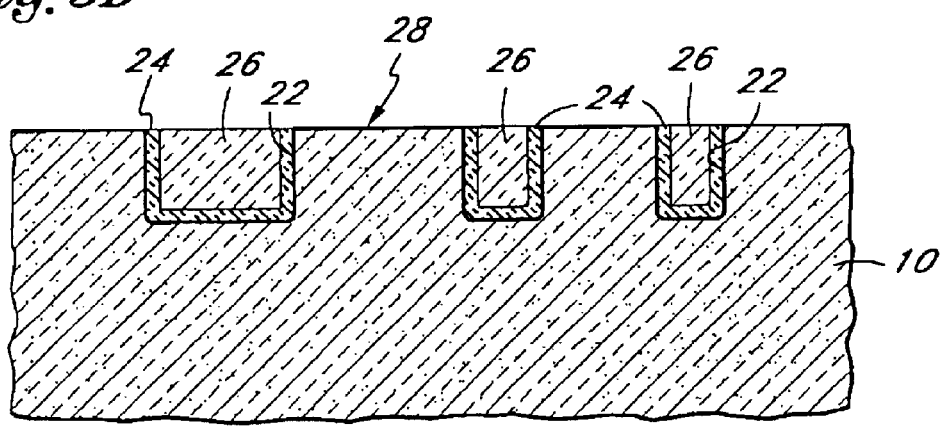

To complete the trench structure, a planarizing step is performed as shown in FIG. 3D. A planarizing process may for example comprise depositing and reflowing a resist layer to attain a planar top surface, followed by an etchback procedure to remove material down to the substrate surface. While the planarizing process may proceed in accordance with well-known processes, the present preferred isolation is advantageous because the shallower trench structures and consequent thinner refilled layers allow for a greater degree of planarity.

Thus, the present invention provides several advantages over the prior art by avoiding cavities in the trenches, providing more effective device isolation using low-$\epsilon$ materials and having a greater degree of planarity in the final trench structure.

Although described above with reference to the preferred embodiments, modifications within the scope of the invention may be apparent to those skilled in the art, all such modifications are intended to be within the scope of the appended claims.

What is claimed is:

1. An isolation structure in a semiconductor substrate comprising:
   a recessed portion formed with a vertical sidewall within the semiconductor substrate; and
   a dielectric material comprising a halide-doped silicon oxide filling the recessed portion, said dielectric material having a dielectric constant lower than the dielectric constant of silicon dioxide.

2. The isolation structure of claim 1, wherein the recessed portion comprises a trench structure having a ratio of height to width of less than 2:1.

3. The isolation structure of claim 1, wherein the recessed portion comprises a trench structure having a depth of less than 200 nm.

4. The isolation structure of claim 1, further comprising a barrier layer disposed between the recessed portion of the semiconductor substrate and the dielectric material.

5. The isolation structure of claim 1, wherein the dielectric material has a dielectric constant lower than 3.9.

6. The isolation structure of claim 1, wherein the dielectric material comprises a Fluoride-doped silicon dioxide composition.

7. An integrated circuit having a plurality of isolation regions within a semiconductor substrate, each isolation region defined by:
   a trench within the substrate, the trench having a characteristic profile produced by an etch process; and
   a halide-doped silicon oxide filling the trench to form an isolation element, an interface between the isolation element and the substrate retaining the characteristic profile of the trench.

8. The integrated circuit of claim 7, wherein the halide-doped silicon oxide has a dielectric constant of less than 3.9.

9. The integrated circuit of claim 7, further comprising a barrier layer disposed between the interface of the semiconductor substrate and the halide-doped silicon oxide.

10. The integrated circuit of claim 7, wherein the halide-doped silicon oxide comprises fluoride-doped silicon dioxide.

* * * * *